(12) United States Patent
Hsueh et al.

(10) Patent No.: US 8,878,582 B2
(45) Date of Patent: Nov. 4, 2014

(54) APPARATUS AND METHOD FOR DUTY CYCLE CALIBRATION

(75) Inventors: Yu-Li Hsueh, Taipei (TW); Chih-Hsien Shen, Zhubei (TW); Jing-Hong Conan Zhan, HsinChu (TW)

(73) Assignee: Mediatek Inc., Hsin-Chu (TW)

( * ) Notice: Subject to any disclaimer, the term of this patent is extended or adjusted under 35 U.S.C. 154(b) by 110 days.

(21) Appl. No.: 13/612,729

(22) Filed: Sep. 12, 2012

(65) Prior Publication Data

US 2013/0141149 A1 Jun. 6, 2013

Related U.S. Application Data

(60) Provisional application No. 61/548,098, filed on Oct. 17, 2011.

(51) Int. Cl.
*H03K 3/017* (2006.01)
*H03K 5/156* (2006.01)

(52) U.S. Cl.
CPC ............. *H03K 3/017* (2013.01); *H03K 5/1565* (2013.01)
USPC .......................................... 327/175; 327/176

(58) Field of Classification Search
USPC ........................................ 327/172, 175, 176
See application file for complete search history.

(56) References Cited

U.S. PATENT DOCUMENTS 7,683,683 B1   3/2010  Majumder et al.
8,466,726 B2 *  6/2013  Satoh et al. ................... 327/175

OTHER PUBLICATIONS

Huh, H., et al.; "A CMOS Dual-Band Fractional-N Synthesizer with Reference Doubler and Compensated Charge Pump;" International Solid State Circuits Conference; Session 5; 2004; pp. 1-10.

* cited by examiner

*Primary Examiner* — Hai L Nguyen
(74) *Attorney, Agent, or Firm* — McClure, Qualey & Rodack, LLP (57) ABSTRACT

An apparatus for duty cycle calibration includes an input calibration circuit, a delay chain, a first comparator, and a second comparator. The input calibration circuit calibrates an input clock signal according to a first control signal so as to generate an input calibration clock signal. The delay chain includes a plurality of delay units coupled in series, and delays the input calibration clock signal so as to generate a first delay clock signal and a second delay clock signal. At least two of the delay units each have an adjustable delay time which is controlled according to a second control signal. The first comparator compares the input calibration clock signal with the first delay clock signal so as to generate the first control signal. The second comparator compares the input calibration clock signal with the second delay clock signal so as to generate the second control signal.

16 Claims, 8 Drawing Sheets

United States Patent US 8,878,582 B2

APPARATUS AND METHOD FOR DUTY CYCLE CALIBRATION

CROSS REFERENCE TO RELATED APPLICATIONS

This application claims the benefit of U.S. Provisional Application No. 61/548,098, filed on Oct. 17, 2011, the entirety of which is incorporated by reference herein.

BACKGROUND OF THE INVENTION

1. Field of the Invention

The disclosure generally relates to an apparatus, and more particularly, relates to an apparatus for duty cycle calibration.

2. Description of the Related Art

A frequency doubler is a common component in a digital circuit and in modern frequency synthesizers to reduce phase noise. Ideally, the frequency doubler is configured to generate an output clock signal in response to an input clock signal, wherein the frequency of the output clock signal is exactly two times greater than that of the input clock signal.

As a matter of fact, the input clock signal often has duty cycle errors, leading to reference spurs in the frequency domain and degrading performance of the associated analog/digital circuits. Accordingly, there is a need to design a new apparatus for duty cycle calibration.

BRIEF SUMMARY OF THE INVENTION

In an exemplary embodiment, the disclosure is directed to an apparatus for duty cycle calibration, comprising: an input calibration circuit, calibrating an input clock signal according to a first control signal so as to generate an input calibration clock signal; a delay chain, comprising a plurality of delay units coupled in series, and delaying the input calibration clock signal so as to generate a first delay clock signal at a first node of the delay chain and generate a second delay clock signal at a second node of the delay chain, wherein at least two of the plurality of delay units each have an adjustable delay time which is controlled according to a second control signal; a first comparator, comparing the input calibration clock signal with the first delay clock signal so as to generate the first control signal; and a second comparator, comparing the input calibration clock signal with the second delay clock signal so as to generate the second control signal.

In another exemplary embodiment, the disclosure is directed to a method for duty cycle calibration, comprising the steps of: (a) delaying an input clock signal by a delay chain comprising a plurality of delay units, and generating a first delay clock signal at a first node of the delay chain and a second delay clock signal at a second node of the delay chain, wherein at least two of the plurality of delay units each have an adjustable delay time; (b) controlling the adjustable delay time such that a total delay time of the delay chain is equal to one clock period of the input clock signal; and (c) calibrating the input clock signal, and generating an input calibration clock signal which has a duty cycle of about 50%.

BRIEF DESCRIPTION OF DRAWINGS

The invention can be better understood by reading the subsequent detailed description and examples with references made to the accompanying drawings, wherein.

DETAILED DESCRIPTION OF THE INVENTION

Figure 1:
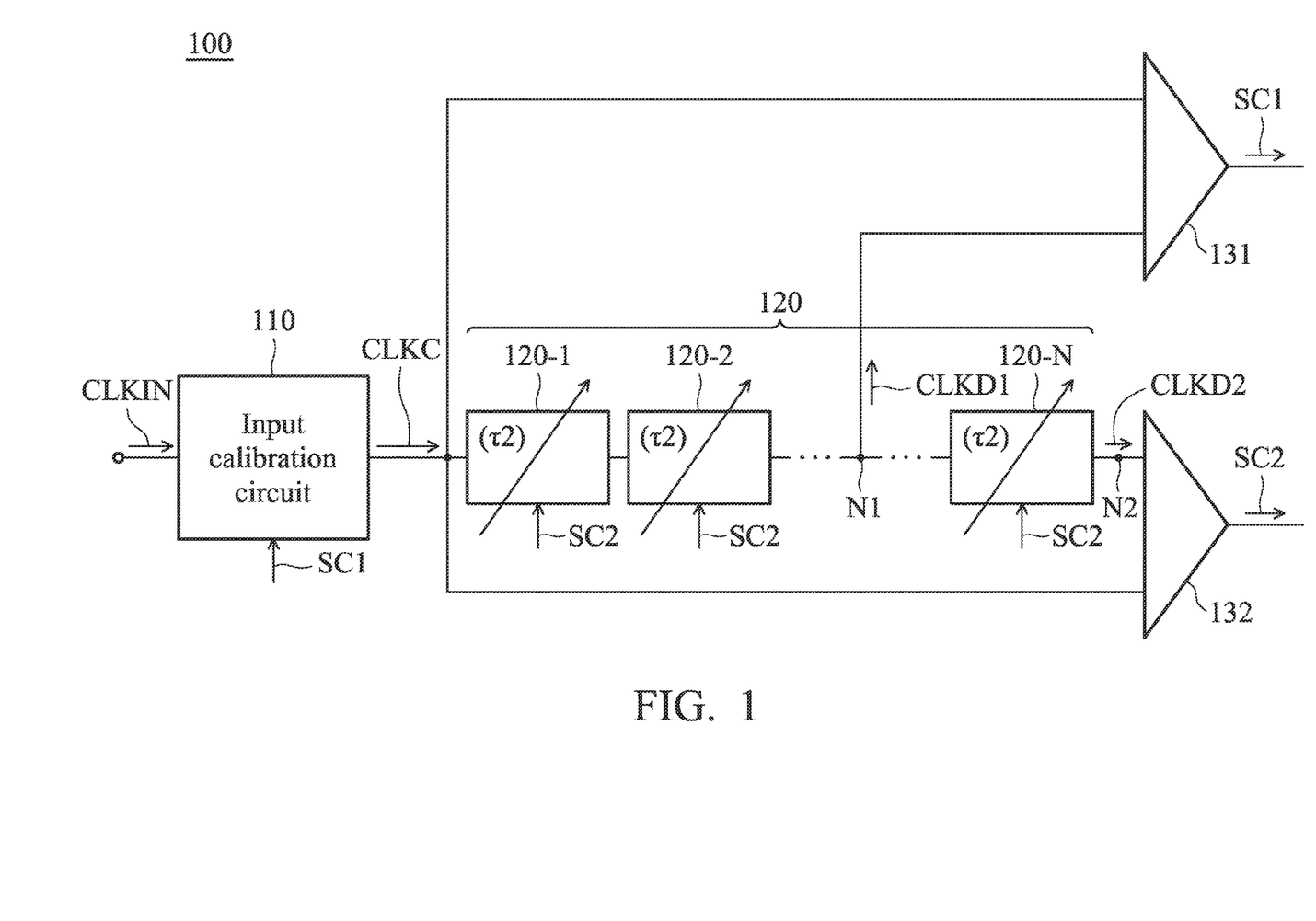
FIG. 1 is a diagram for illustrating an apparatus for duty cycle calibration according to an embodiment of the invention.

FIG. 1 is a diagram for illustrating an apparatus 100 for duty cycle calibration according to an embodiment of the invention. As shown in FIG. 1, the apparatus 100 at least comprises an input calibration circuit 110, a delay chain 120 comprising a plurality of delay units 120-1, 120-2, . . . , and 120-N coupled in series, a first comparator 131, and a second comparator 132. The input calibration circuit 110 is configured to calibrate an input clock signal CLKIN according to a first control signal SC1 so as to generate an input calibration clock signal CLKC. The delay chain 120 is configured to delay the input calibration clock signal CLKC so as to generate a first delay clock signal CLKD1 at a first node N1 of the delay chain 120 and generate a second delay clock signal CLKD2 at a second node N2 of the delay chain 120. In a preferred embodiment, a half of the delay units 120-1, 120-2, . . . , and 120-N are disposed between the first node N1 and the second node N2. For example, if N is equal to 8, there will be 4 delay units disposed between the first node Ni and the second node N2. In one example, the second node N2 may be an end node of the chain of delay units 120-1, 120-2, . . . , and 120-N. However, the invention is not limited to that, and the second node N2 may be an internal node thereof in other embodiments. At least two delay units (e.g, for the delay units 120-1 and 120-N, one is in front of the first node N1, and another is in back of the first node N1) of the delay units 120-1, 120-2, . . . , and 120-N each have an adjustable delay time τ2, which is controlled according to a second control signal SC2. In some embodiments, each of the delay units 120-1, 120-2, . . . , and 120-N has the adjustable delay time τ2. The first comparator 131 is configured to compare the input calibration clock signal CLKC with the first delay clock signal CLKD1 so as to generate the first control signal SC1. The second comparator 132 is configured to compare the input calibration clock signal CLKC with the second delay clock signal CLKD2 so as to generate the second control signal SC2. Note that the input calibration circuit 110 and the delay units 120-1, 120-2, . . . , and 120-N may not directly receive the first control signal SC1 and the second control signal SC2. In some embodiments, the input calibration circuit 110 and the delay units 120-1, 120-2, . . . , and 120-N are controlled by other devices according to the first control signal SC1 and the second control signal SC2.

The apparatus 100 may be operated as follows. After the adjustable delay time τ2 has been controlled according to the second control signal SC2, a total delay time of the delay chain 120 is equal to one clock period of the input clock signal CLKIN. After the input clock signal CLKIN has been calibrated by the input calibration circuit 110, the input calibration clock signal CLKC has a duty cycle of about 50%. In a preferred embodiment, the input clock signal CLKIN is calibrated according to the first control signal SC1 after the adjustable delay time τ2 has been controlled according to the second control signal SC2.

Figure 2:
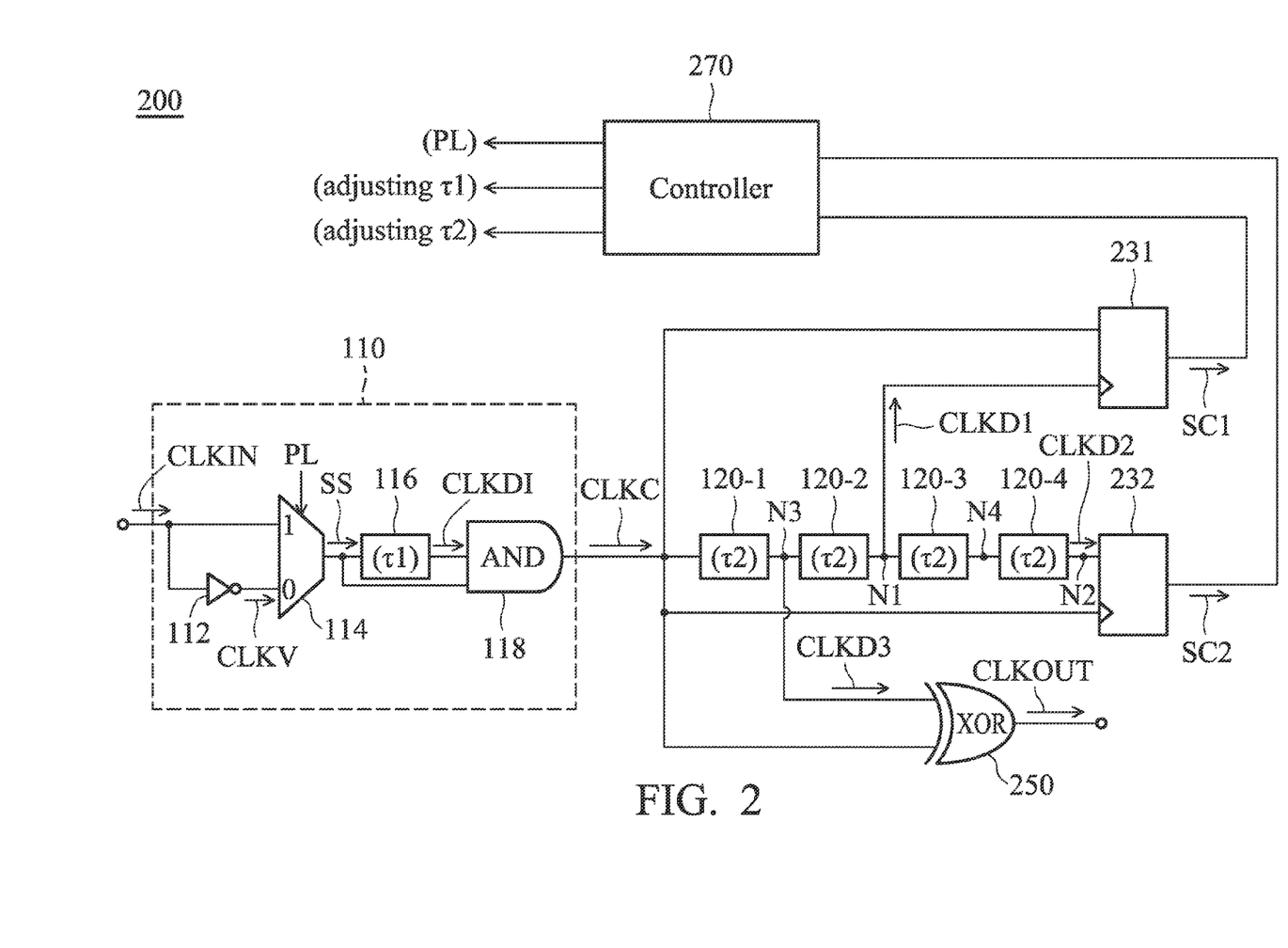
FIG. 2 is a diagram for illustrating an apparatus for duty cycle calibration according to an embodiment of the invention.

FIG. 2 is a diagram for illustrating an apparatus 200 for duty cycle calibration according to an embodiment of the invention. As shown in FIG. 2, the apparatus 200 comprises the input calibration circuit 110, the delay chain 120 comprising delay units 120-1, 120-2, 120-3, and 120-4 coupled in series, D flip-flops 231 and 232, an XOR gate 250, and a controller 270. In the embodiments, the number N of the delay units is equal to 4, and first comparator 131 and the second comparator 132 are implemented by the D flip-flops 231 and 232. The apparatus 200 may be used as a frequency doubler. The delay chain 120 is further configured to generate a third delay clock signal CLKD3 at a third node N3 of the delay chain 120. In a preferred embodiment, a quarter (e.g., the delay unit 120-2) of the delay units 120-1, 120-2, 120-3, and 120-4 are disposed between the third node N3 and the first node N1. In another embodiment, if N is equal to 8, there will be 2 delay units disposed between the third node N3 and the first node N1. The XOR gate 250 is configured to generate an output clock signal CLKOUT according to the input calibration clock signal CLKC and the third delay clock signal CLKD3, wherein a clock frequency of the output clock signal CLKOUT is substantially two times greater than that of the input calibration clock signal CLKC and that of the input clock signal CLKIN.

As shown in FIG. 2, the input calibration circuit 110 comprises an inverter 112, a multiplexer 114, an input delay unit 116, and an AND gate 118. The inverter 112 is configured to generate an input inverted clock signal CLKV according to the input clock signal CLKIN. The multiplexer 114 selects either the input clock signal CLKIN or the input inverted clock signal CLKV according to the first control signal SC1 so as to forward a selected clock signal SS. More particularly, the controller 270 may generate a selection signal PL according to the first control signal SC1. If the selection signal PL is equal to a logic level 1, the multiplexer 114 will select the input clock signal CLKIN as the selected clock signal SS. If the selection signal PL is equal to a logic level 0, the multiplexer 114 will select the input inverted clock signal CLKV as the selected clock signal SS. The input delay unit 116 is configured to delay the selected clock signal SS for an input delay time τ1 so as to generate an input delay clock signal CLKDI, wherein the input delay time τ1 is controlled according to the first control signal SC1. The AND gate 118 is configured to generate the input calibration clock signal CLKC according to the selected clock signal SS and the input delay clock signal CLKDI.

The controller 270 may be a DSP (Digital Signal Processor). In a preferred embodiment, the controller 270 is arranged to control the adjustable delay time τ2 according to the second control signal SC2 so as to align the rising edges of the second delay clock signal CLKD2 with the rising edges of the input calibration clock signal CLKC, and arranged to control the input delay time τ1 according to the first control signal SC1 so as to align the rising edges of the first delay clock signal CLKD 1 with the falling edges of the input calibration clock signal CLKC. In addition, after the adjustable delay time τ2 has been controlled and the input clock signal CLKIN has been calibrated (or the input delay time τ1 has been controlled), a part (e.g., the delay units 120-2, 120-3, and 120-4) of the delay units 120-1, 120-2, 120-3, and 120-4 between the third node N3 and the second node N2 are turned off so as to save electrical power. The operation of the apparatus 200 will be described in detail as follows.

Figure 3A:
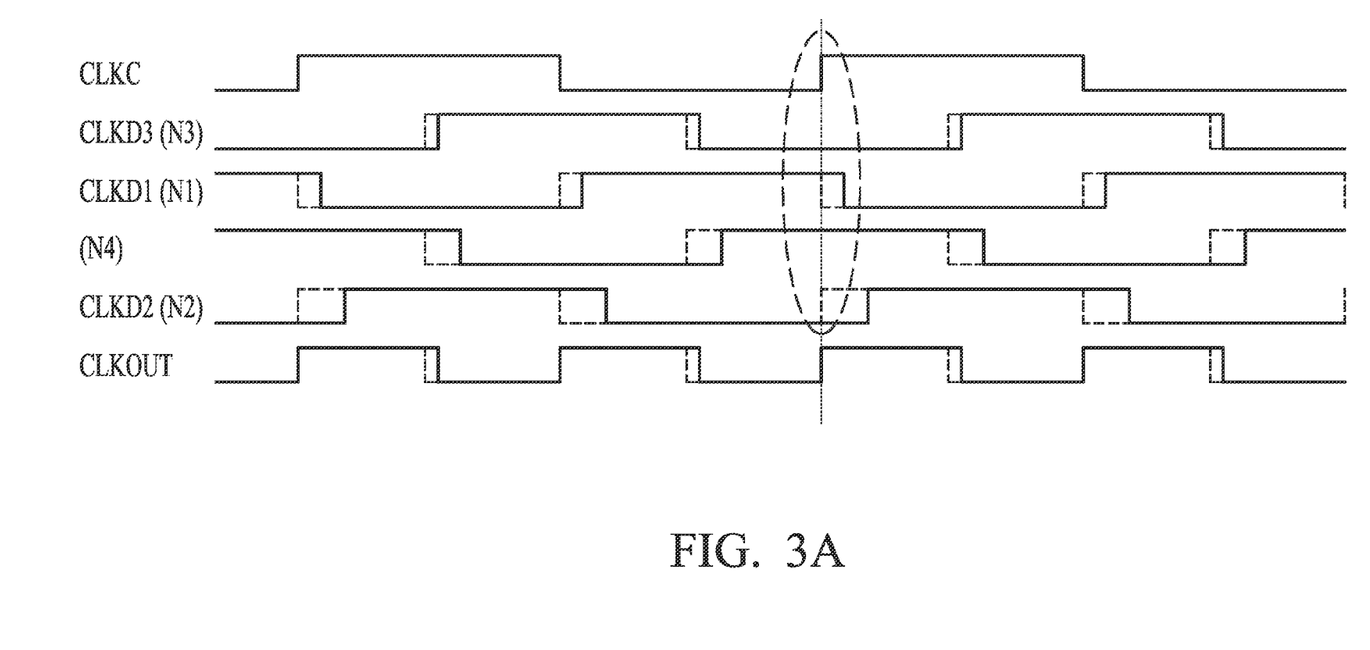
FIG. 3A is a diagram of waveforms of some clock signals for illustrating that rising edges of a second delay clock signal are aligned with rising edges of an input calibration clock signal according to an embodiment of the invention.

FIG. 3A is a diagram of waveforms of some clock signals for illustrating that the rising edges of the second delay clock signal CLKD2 are aligned with the rising edges of the input calibration clock signal CLKC according to an embodiment of the invention. In the embodiments, the original adjustable delay time τ2 is too long. As shown in FIG. 3A, solid lines represent the waveforms of the clock signals without calibration, and dashed lines represent the waveforms of the clock signals after the adjustable delay time τ2 has been controlled appropriately. The D flip-flop 232 (or the second comparator 132) may sample the second delay clock signal CLKD2 (at the second node N2) at every rising edge of the input calibration clock signal CLKC. If the adjustable delay time τ2 is too long, the second control signal SC2 outputted by the D flip-flop 232 will be equal to a logic level 0. By continuously monitoring the second control signal SC2, the controller 270 can control the adjustable delay time τ2 appropriately so as to align the rising edges of the second delay clock signal CLKD2 with the rising edges of the input calibration clock signal CLKC, and accordingly, the total delay time (e.g., τ2*4) of the delay chain 120 will be equal to one clock period of the input clock signal CLKIN.

Figure 3B:
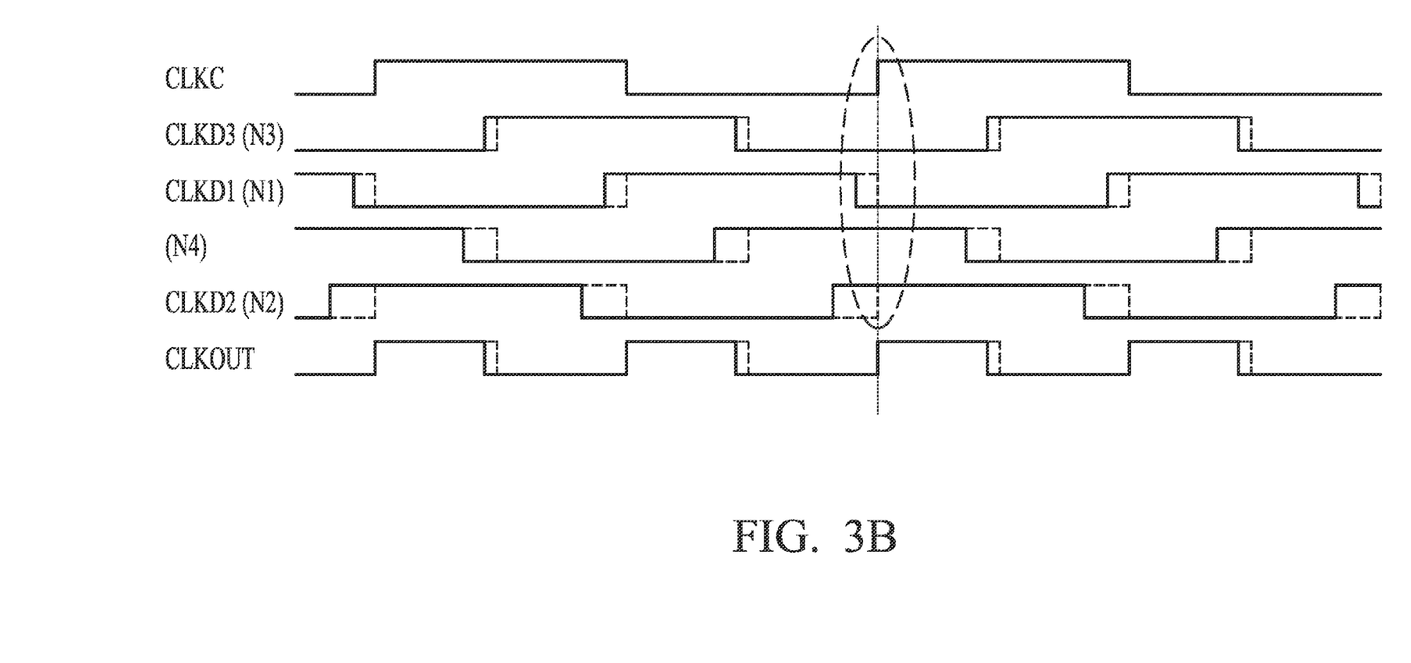
FIG. 3B is a diagram of waveforms of some clock signals for illustrating that rising edges of a second delay clock signal are aligned with rising edges of an input calibration clock signal according to another embodiment of the invention.

FIG. 3B is a diagram of waveforms of some clock signals for illustrating that the rising edges of the second delay clock signal CLKD2 are aligned with the rising edges of the input calibration clock signal CLKC according to another embodiment of the invention. In the embodiments, the original adjustable delay time τ2 is too short. If the adjustable delay time τ2 is too short, the second control signal SC2 outputted by the D flip-flop 232 will be equal to a logic level 1. Similarly, by continuously monitoring the second control signal SC2, the controller 270 can control the adjustable delay time τ2 appropriately so as to align the rising edges of the second delay clock signal CLKD2 with the rising edges of the input calibration clock signal CLKC, and accordingly, the total delay time (e.g., τ2*4) of the delay chain 120 will be equal to one clock period of the input clock signal CLKIN.

Figure 4A:
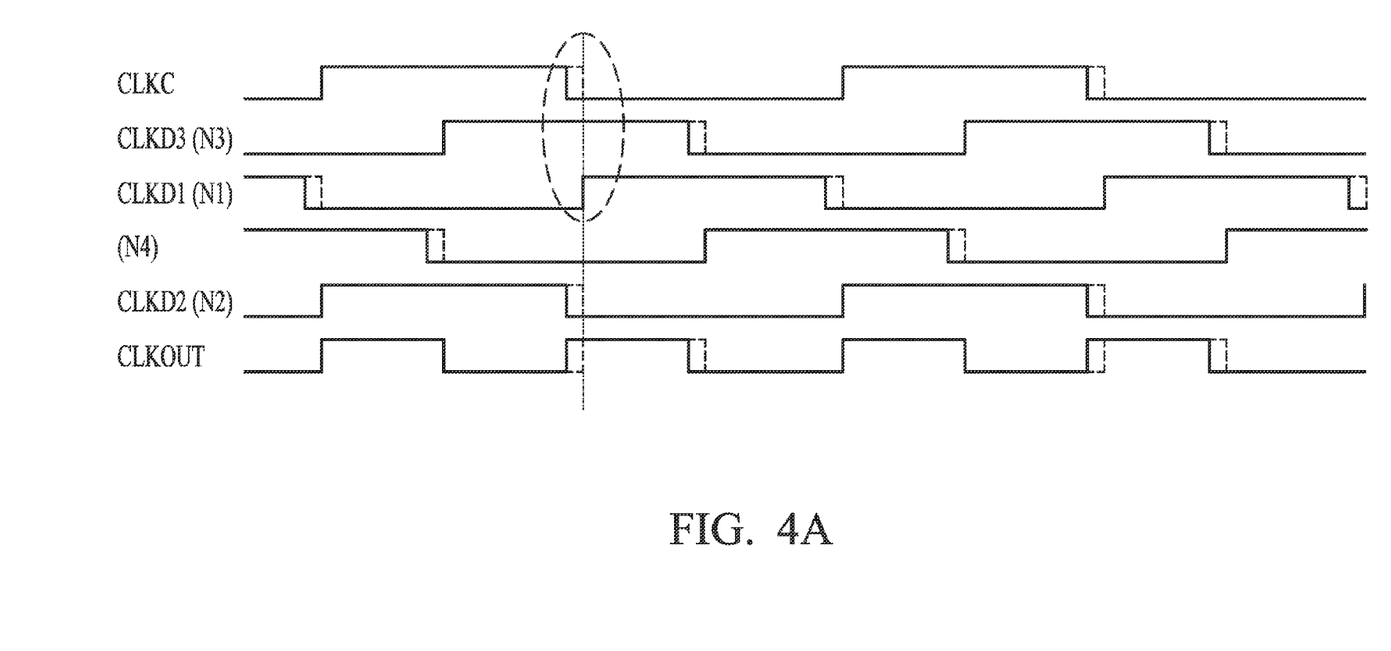
FIG. 4A is a diagram of waveforms of some clock signals for illustrating that rising edges of a first delay clock signal are aligned with falling edges of an input calibration clock signal according to an embodiment of the invention.

FIG. 4A is a diagram of waveforms of some clock signals for illustrating that the rising edges of the first delay clock signal CLKD 1 are aligned with the falling edges of the input calibration clock signal CLKC according to an embodiment of the invention. In the embodiments, the duty cycle of the input clock signal CLKIN is smaller than 50%, and accordingly, the duty cycle of the input calibration clock signal CLKC is also smaller than 50% (in the case, the original input delay time τ1 is assumed to be 0). As shown in FIG. 4A, solid lines represent the waveforms of the clock signals without calibration, and dashed lines represent the waveforms of the clock signals after the input delay time τ1 has been controlled appropriately. The D flip-flop 231 (or the first comparator 131) may sample the input calibration clock signal CLKC at every rising edge of the first delay clock signal CLKD1 (at the first node N1). If the duty cycle of the input calibration clock signal CLKC is smaller than 50%, the first control signal SC1 outputted by the D flip-flop 231 will be equal to a logic level 0. By continuously monitoring the first control signal SC1, the controller 270 can control the input delay time τ1 appropriately so as to align the rising edges of the first delay clock signal CLKD1 with the falling edges of the input calibration clock signal CLKC, and accordingly, the input calibration clock signal CLKC will have a duty cycle of about 50%.

Figure 4B:
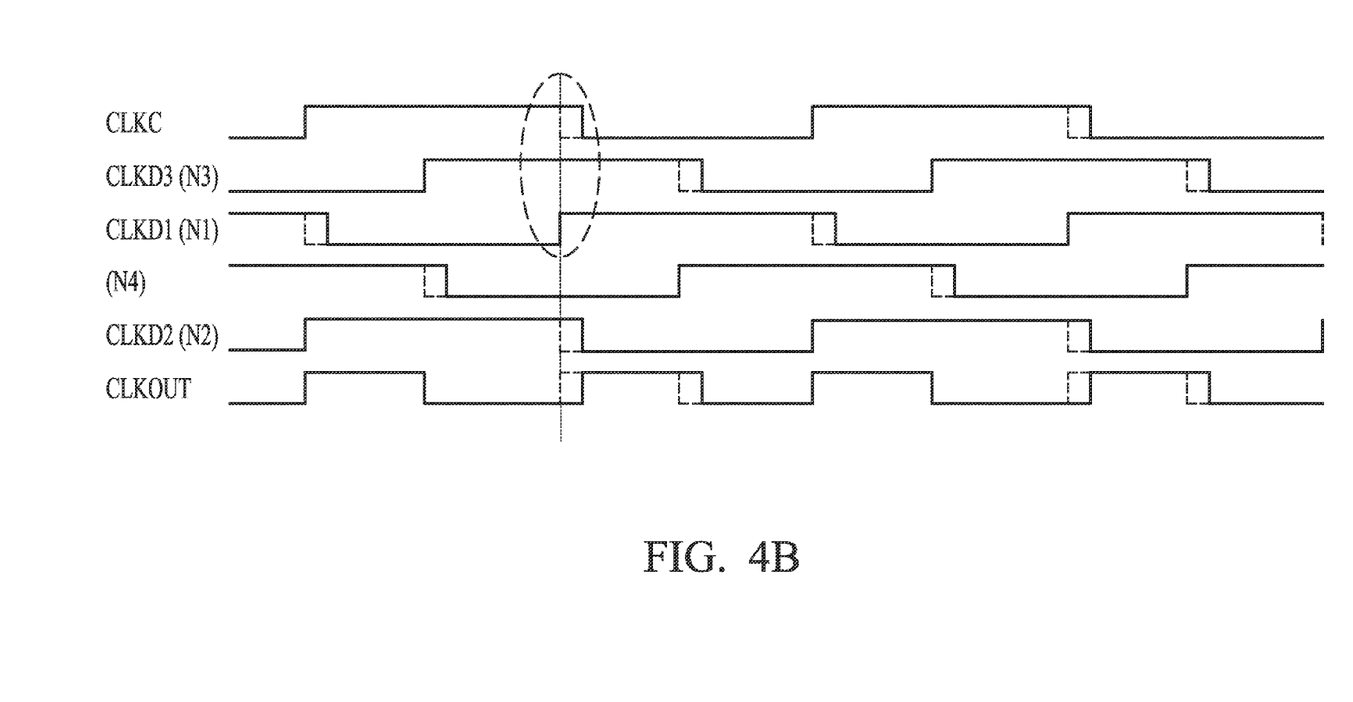
FIG. 4B is a diagram of waveforms of some clock signals for illustrating that rising edges of a first delay clock signal are aligned with falling edges of an input calibration clock signal according to another embodiment of the invention.

FIG. 4B is a diagram of waveforms of some clock signals for illustrating that the rising edges of the first delay clock signal CLKD 1 are aligned with the falling edges of the input calibration clock signal CLKC according to another embodiment of the invention. In the embodiments, the duty cycle of the input clock signal CLKIN is greater than 50%, and accordingly, the duty cycle of the input calibration clock signal CLKC is also greater than 50% (in the case, the original input delay time τ1 is assumed to be 0). If the duty cycle of the input calibration clock signal CLKC is greater than 50%, the first control signal SC1 outputted by the D flip-flop 231 will be equal to a logic level 1. By continuously monitoring the first control signal SC1, the controller 270 can control the input delay time τ1 appropriately so as to align the rising edges of the first delay clock signal CLKD1 with the falling edges of the input calibration clock signal CLKC, and accordingly, the input calibration clock signal CLKC will have a duty cycle of about 50%.

Figure 5:
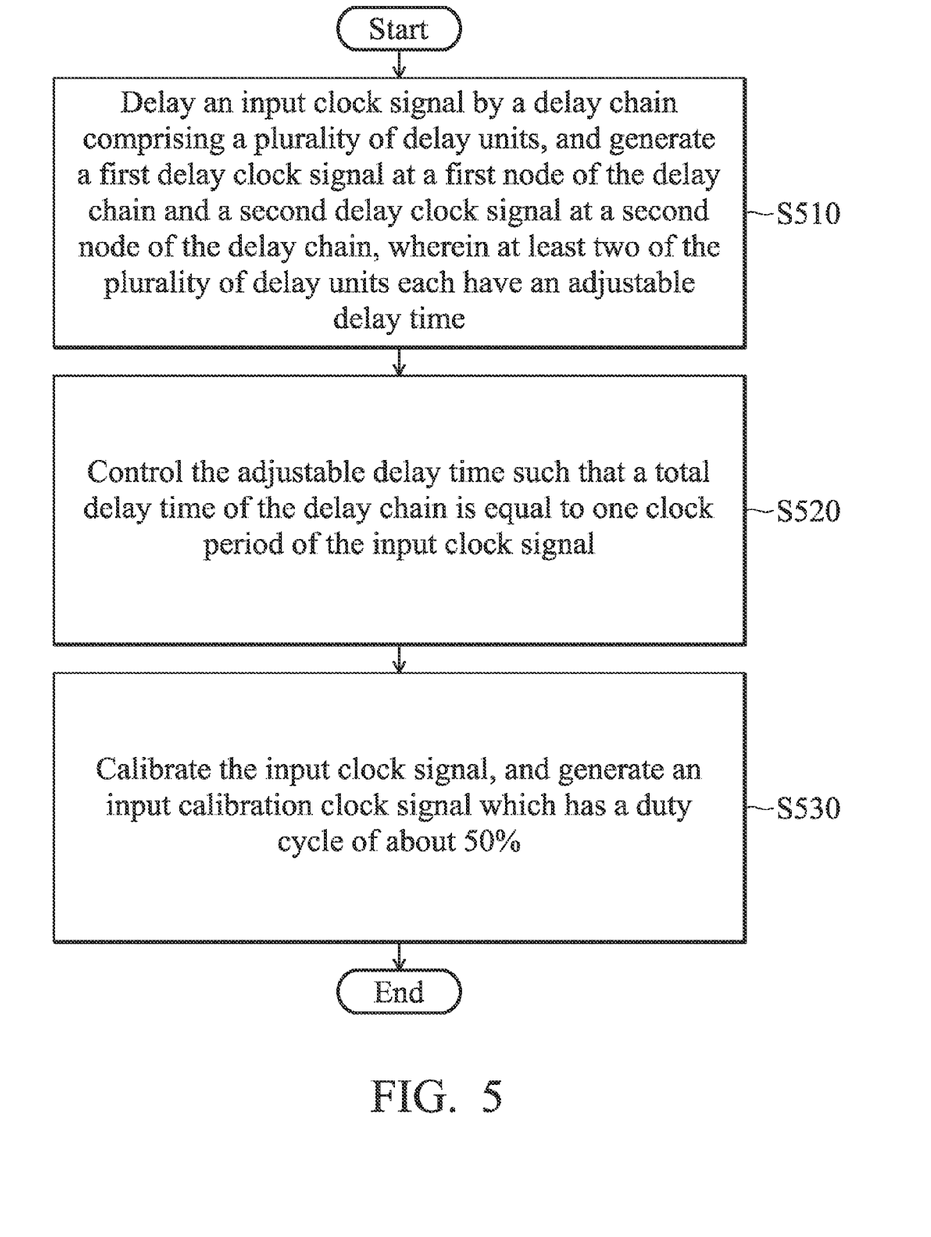
FIG. 5 is a flowchart for illustrating a method for duty cycle calibration according to an embodiment of the invention.

FIG. 5 is a flowchart for illustrating a method for duty cycle calibration according to an embodiment of the invention. To begin, in step S510, an input clock signal is delayed by a delay chain comprising a plurality of delay units, and a first delay clock signal is generated at a first node of the delay chain, and a second delay clock signal is generated at a second node of the delay chain, wherein at least two of the plurality of delay units each have an adjustable delay time. In step S520, the adjustable delay time is controlled such that a total delay time of the delay chain is equal to one clock period of the input clock signal. Finally, in step S530, the input clock signal is calibrated, and an input calibration clock signal which has a duty cycle of about 50% is generated. Note that all of the embodiments in FIG. 1-4B may be applied to the foregoing method.

Figure 6:
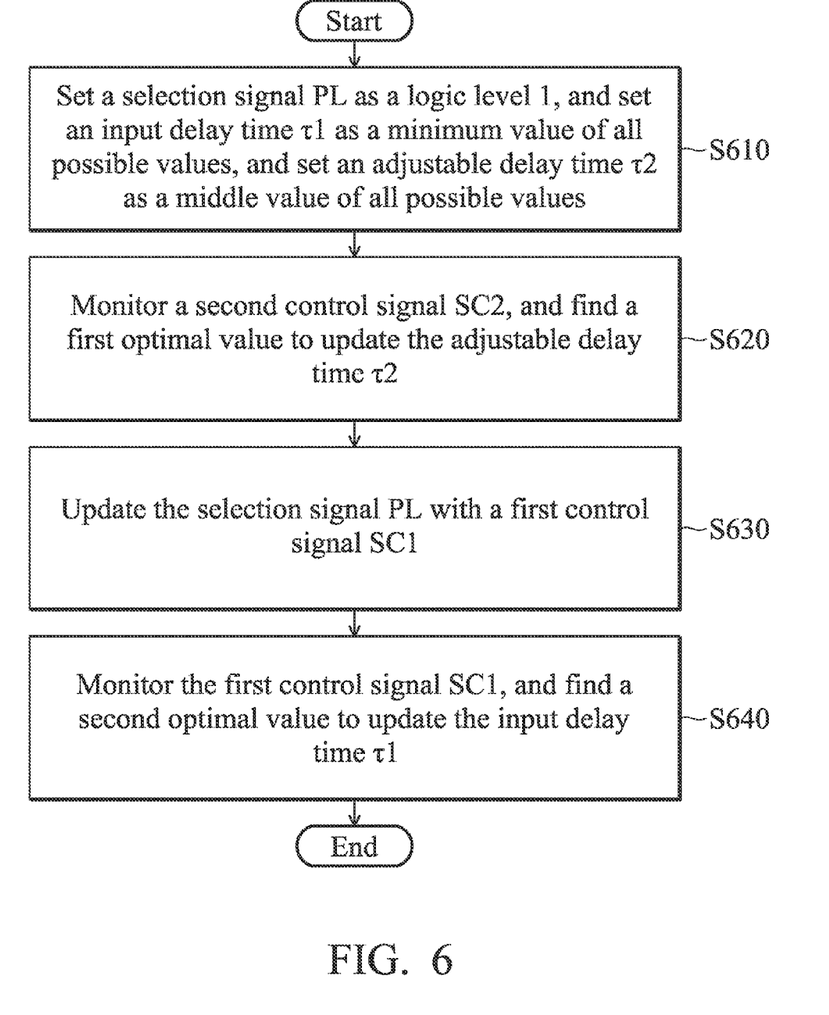
FIG. 6 is a flowchart for illustrating operation of the apparatus for duty cycle calibration according to an embodiment of the invention.

FIG. 6 is a flowchart for illustrating operation of the apparatus 200 for duty cycle calibration according to an embodiment of the invention. In the embodiment, the apparatus 200 in FIG. 2 may be operated as follows. To begin, in step S610, the selection signal PL is set as a logic level 1, and the input delay time τ1 is set as a minimum value of all possible values, and the adjustable delay time τ2 is set as a middle value of all possible values. For example, if the input delay time τ1 has possible values of 1, 2, 3, 4, and 5 (time unit), the set minimum value will be 1. For example, if the adjustable delay time τ2 has possible values of 1, 2, 3, 4, and 5 (time unit), the set middle value will be 3. In step S620, the second control signal SC2 is monitored by the controller 270, and a first optimal value is found by the controller 270 to update the adjustable delay time τ2. In some embodiments, the controller 270 finds the first optimal value of the adjustable delay time τ2 by making a binary search among all possible values of the adjustable delay time τ2. In step S630, the selection signal PL is updated with the first control signal SC1. Finally, in step S640, the first control signal SC1 is monitored by the controller 270, and a second optimal value is found by the controller 270 to update the input delay time τ1. In some embodiments, the controller 270 finds the second optimal value of the input delay time τ1 by making a binary search among all possible values of the input delay time τ1.

The apparatus and method for duty cycle calibration in the embodiments not only calibrate the adjustable delay time of the delay chain but also calibrate the duty cycle of the input clock signal. Therefore, the apparatus may be used as a good frequency doubler for reducing clock spurs, and can improve performance of frequency synthesizer or associated analog/digital circuits utilizing duty cycle therein. It takes just a few clock cycles to finish the whole calibration process.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. An apparatus for duty cycle calibration, comprising:
   an input calibration circuit, calibrating an input clock signal by applying logic operations and delay on the input clock signal so as to generate an input calibration clock signal;
   a delay chain, comprising a plurality of delay units coupled in series, and delaying the input calibration clock signal so as to generate a first delay clock signal at a first node of the delay chain and generate a second delay clock signal at a second node of the delay chain, wherein at least two of the plurality of delay units each have an adjustable delay time;
   a first comparator, comparing the input calibration clock signal with the first delay clock signal so as to generate a first control signal;
   a second comparator, comparing the input calibration clock signal with the second delay clock signal so as to generate a second control signal; and
   a controller, arranged to control the delay according to the first control signal and to control the adjustable delay time according to the second control signal.

2. The apparatus as claimed in claim 1, wherein the input calibration clock has a duty cycle of about 50%.

3. The apparatus as claimed in claim 1,
   wherein the controller is further arranged to control the adjustable delay time according to the second control signal so as to align rising edges of the second delay clock signal with rising edges of the input calibration clock signal.

4. The apparatus as claimed in claim 1, wherein the first and second comparators are implemented by D flip-flops.

5. The apparatus as claimed in claim 1, wherein a half of the delay units are disposed between the first node and the second node.

6. The apparatus as claimed in claim 1, wherein the input calibration circuit comprises:
   an inverter, generating an input inverted clock signal according to the input clock signal;
   a multiplexer, selecting either the input clock signal or the input inverted clock signal according to the first control signal so as to forward a selected clock signal;
   an input delay unit, delaying the selected clock signal for an input delay time so as to generate an input delay clock signal, wherein the input delay time is controlled according to the first control signal; and
   an AND gate, generating the input calibration clock signal according to the selected clock signal and the input delay clock signal.

7. The apparatus as claimed in claim 6,
wherein the controller is further arranged to control the input delay time according to the first control signal so as to align the rising edges of the first delay clock signal with the falling edges of the input calibration clock signal.

8. The apparatus as claimed in claim 1, wherein the adjustable delay time is arranged to be controlled such that a total delay time of the delay chain is equal to one clock period of the input clock signal.

9. The apparatus as claimed in claim 1, wherein the input clock signal is calibrated according to the first control signal by the input calibration circuit after the adjustable delay time has been controlled according to the second control signal.

10. The apparatus as claimed in claim 1, being a frequency doubler, wherein the delay chain further generates a third delay clock signal at a third node of the delay chain, and the apparatus further comprises:
an XOR gate, generating an output clock signal according to the input calibration clock signal and the third delay clock signal, wherein a clock frequency of the output clock signal is two times greater than a clock frequency of the input clock signal.

11. The apparatus as claimed in claim 10, wherein a quarter of the delay units are disposed between the third node and the first node.

12. The apparatus as claimed in claim 10, wherein after the adjustable delay time has been controlled and the input clock signal has been calibrated, a part of the plurality of delay units between the third node and the second node are turned off.

13. A method for duty cycle calibration, comprising the steps of:
(a) delaying an input calibration clock signal by a delay chain comprising a plurality of delay units, and generating a first delay clock signal at a first node of the delay chain and a second delay clock signal at a second node of the delay chain, wherein at least two of the plurality of delay units each have an adjustable delay time which is controlled by a controller;
(b) controlling, by the controller, the adjustable delay time such that a total delay time of the delay chain is equal to one clock period an input clock signal, wherein the input calibration clock signal is derived from the input clock signal; and
(c) comparing the first delay clock signal and the input calibration clock signal and accordingly calibrating the input clock signal so as to make the input calibration clock signal having a duty cycle of about 50%.

14. The method as claimed in claim 13, wherein the step (b) further comprises:
controlling the adjustable delay time such that rising edges of the second delay clock signal are aligned with rising edges of the input clock signal.

15. The method as claimed in claim 13, wherein the step (c) further comprises:
aligning rising edges of the first delay clock signal with falling edges of the input clock signal.

16. The method as claimed in claim 13, wherein the step (c) is performed after the step (b) has been completed.

* * * * *